United States Patent
Kondo

(10) Patent No.: US 7,244,662 B2
(45) Date of Patent: Jul. 17, 2007

(54) METHOD FOR MANUFACTURING SEMICONDUCTOR INTEGRATED CIRCUIT

(75) Inventor: Takayuki Kondo, Suwa (JP)

(73) Assignee: Seiko Epson Corporation, Tokyo (JP)

(*) Notice: Subject to any disclaimer, the term of this patent is extended or adjusted under 35 U.S.C. 154(b) by 422 days.

(21) Appl. No.: 10/322,555

(22) Filed: Dec. 19, 2002

(65) Prior Publication Data

US 2003/0170965 A1 Sep. 11, 2003

(30) Foreign Application Priority Data

Dec. 27, 2001 (JP) ............................. 2001-398200

(51) Int. Cl.
*H01L 21/46* (2006.01)

(52) U.S. Cl. ...................... 438/458; 438/455; 438/459

(58) Field of Classification Search ................ 438/455, 438/458, 459
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,073,230 A | 12/1991 | Maracas et al. | |
| 5,286,335 A | 2/1994 | Drabik et al. | |
| 5,300,788 A | 4/1994 | Fan et al. | |
| 5,391,257 A | 2/1995 | Sullivan et al. | |
| 5,401,983 A | 3/1995 | Jokerst et al. | |
| 5,465,009 A | 11/1995 | Drabik et al. | |
| 5,827,751 A * | 10/1998 | Nuyen | 438/28 |
| 6,033,995 A | 3/2000 | Muller | |
| 6,214,733 B1 * | 4/2001 | Sickmiller | 438/691 |
| 6,291,266 B1 | 9/2001 | Sayyah | |

FOREIGN PATENT DOCUMENTS

| | | |
|---|---|---|
| JP | 57-51781 | 3/1982 |
| JP | 59-194393 | 11/1984 |
| JP | A 63-175860 | 7/1988 |
| JP | A 2-135359 | 5/1990 |
| JP | A 2-135361 | 5/1990 |
| JP | A 2-209988 | 8/1990 |
| JP | A 3-379992 | 2/1991 |
| JP | A 3-152184 | 6/1991 |
| JP | A 6-151720 | 5/1994 |

(Continued)

OTHER PUBLICATIONS

Ali Ersen et al.; "Direct Bonding of Gaas Films on Silicon Circuits by Epitaxial Liftoff". Solid State Electronics, Elsevier Science Publishers, Barking, GB. vol. 36, No. 12, pp. 1731-1739 Dec. 1, 1993.

(Continued)

*Primary Examiner*—Jack Chen
(74) *Attorney, Agent, or Firm*—Oliff & Berridge, PLC

(57) ABSTRACT

A method for manufacturing a semiconductor integrated circuit includes steps of forming a semiconductor element on a semiconductor substrate and separating only a function layer including the semiconductor element, which is a surface layer of the semiconductor substrate, from the semiconductor substrate. The semiconductor element is preferably a compound semiconductor device including at least one of a light emitting diode, a vertical cavity surface emitting laserdiode, a photodiode, a high electron mobility transistor, an inductor, a capacitor, a resistor, and a heterojunction bipolar transistor.

14 Claims, 14 Drawing Sheets

FOREIGN PATENT DOCUMENTS

| | | |
|---|---|---|
| JP | A 9-503622 | 4/1997 |
| JP | A 63-70257 | 3/1998 |
| JP | A 2000-58562 | 2/2000 |
| WO | WO 95/09438 A1 | 4/1995 |

OTHER PUBLICATIONS

C. Kaneshiro et al.; "Transfer and Bonding Process of Semiconcductor Coupled SAW Device Suited for Mass-Production". Institute of Electrical and Electronics Engineers; 2001 IEEE Ultrasonics Symposium Proceedings, New York, NY; IEEE, US, vol. 2 of 2, pp. 221-224, Oct. 7, 2001.

H. Nguyen et al.; "A Substrate-Independent Wafer Transfer Technique for Surface-Micromachined Devices". Proceeding IEEE Thirteenth Annual International Conference on Micro Electric Mechanical Systems; pp. 628-632, Jan. 23, 2000.

Takamori et al, Inter-Chip Optical Interconnection Using Planar Type Photonic Circuit and Optoelectronic Integrated Devices, Sep. 2001, pp. 784-792 (w/ translation).

Wada, Interconnection key component techniques, ELECTRONICS, Oct. 2000 (w/ translation).

H. Fathollahnejad et al., "The integration of GaAs vertical-cavity surface emitting lasers onto silicon circuitry," High Speed Semiconductor Devices and Circuits, 1995, IEEE Proceedings, pp. 373-381, Aug. 7, 1995.

\* cited by examiner

METHOD FOR MANUFACTURING SEMICONDUCTOR INTEGRATED CIRCUIT

BACKGROUND OF THE INVENTION

1. Field of the Invention

The present invention relates to semiconductor integrated circuits, methods for manufacturing semiconductor integrated circuits, semiconductor element members, electrooptic devices, and electronic devices. More specifically, the present invention relates to a method for transferring a semiconductor element onto an object having material properties different from those of the semiconductor element, such as a substrate.

2. Description of Related Art

Techniques relating to the formation of a semiconductor element on a substrate, which has material properties different from those of the semiconductor element, have been proposed in the field. Such techniques include, for instance, formation of a vertical cavity surface emitting laserdiode (VCSEL), a photodiode (PD), or a high electron mobility transistor (HEMT) on a silicon semiconductor substrate, and attachment of a micro-silicon transistor, instead of a thin film transistor (TFT) of each pixel of a liquid crystal display (LCD), onto a glass substrate.

Examples of the integrated circuits including such a semiconductor having different material properties include an optoelectronic integrated circuit (OEIC). The optoelectronic integrated circuit is an integrated circuit having an optical input/output means. Signal processing in the OEIC is electrically performed whereas light is used for input and output processes of the OEIC.

On the other hand, CPU internal operation speed (internal clocks) in computers has been improved each year due to progress in fine pitch connection in the internal structure of an integrated circuit. However, the improvements in signal transmittance rate in a bus has nearly reached its limit, and this has become a bottle neck in improving the processing rate of a computer. If the signal transmission can be performed using an optical signal in the bus, it becomes possible to significantly improve the limit on the processing rate of a computer. In order to realize this, it is necessary to integrate minute light emitting/detecting diodes into an integrated circuit made of silicon.

However, since silicon is an indirect transition semiconductor, it cannot emit light by itself. Accordingly, it is necessary to form an integrated circuit by combining silicon with another semiconductor light emitting diode.

The VCSEL made from a GaAs compound semiconductor, etc., may be favorably used as a semiconductor light emitting diode. However, it is extremely difficult to directly form the VCSEL on a silicon integrated circuit using a semiconductor process, such as epitaxy, since the VCSEL does not match the lattice structure of silicon.

In general, the VCSEL is formed on a GaAs substrate. Thus, a method has been considered in which an electric signal transmission circuit is merged with an optical signal transmission circuit by making the VCSEL on the GaAs substrate into a chip and mechanically mounting the chip on a silicon integrated circuit substrate.

On the other hand, it is preferable that the size of the VCSEL chip on an integrated circuit be as small as possible from the viewpoint of effectively using the surface of the semiconductor substrate on which the integrated circuit is formed, and of readiness in handling the chip after merging. It is ideal for the size of the chip to be about the same size as a monolithic integrated circuit, i.e., dimensions of a few $\mu m$ in thickness× a few tens of $\mu m^2$ in surface area. However, according to convention semiconductor mounting techniques, the size of a chip that can be handled is greater than a few tens of $\mu m$ in thickness× a few hundreds of $\mu m^2$ in surface area.

In relation to the above, there are techniques described in "Electronics", pp. 37–40, (October 2000) and in "Denshi Joho Tsushin Gakkai Ronbunn-shi (The Institute of Electronics, Information and Communication Engineers Journal), 2001/9, Vol. J84-C No. 9. In the techniques described in the above publications, a substrate is removed by abrasion, and only a functional layer (a few $\mu m$ thick) of an extreme surface layer, which becomes a semiconductor element, is transferred onto another supporting substrate. Then, the functional layer is formed into a desired size using handling and photolithography techniques, and is joined to a final substrate. In this manner, a semiconductor layer (a functional layer) a few $\mu m$ thick, which becomes a target semiconductor element, is formed on a desired position of the final substrate. This is processed using a normal semiconductor process, and is made into a product by attaching electrodes, etc.

Problems associated with the conventional techniques described in the above publications include that a supporting substrate of a rigid body becomes necessary since the semiconductor substrate is removed by abrasion. For this reason, it becomes necessary to carry out the joining process to the final substrate at one time for the whole surface. That is, semiconductor membranes at all portions other than the portions that become finally necessary must be removed prior to the joining process. Accordingly, a number of steps become necessary and the process becomes complicated. Also, since the portion that is joined is mere a functional layer, it is necessary to perform a semiconductor process after the joining process. Therefore, a number of steps become necessary for treating the final substrate one by one, especially when the arrangement of target semiconductor elements is not very dense.

SUMMARY OF THE INVENTION

The present invention takes into consideration the above-mentioned circumstances, and it has as an object to solve the above problems generated when a semiconductor element is formed on an object having material properties different from those of the semiconductor element to improve the efficiency in using the semiconductor substrate on which the semiconductor element is formed, and to provide semiconductor integrated circuits, methods for manufacturing the semiconductor integrated circuit, semiconductor element members, electrooptic devices, and electronic devices by which unnecessary activity in the manufacturing process of the integrated circuit can be reduced.

In order to achieve the above object, the first aspect of the present invention provides a method for manufacturing a semiconductor integrated circuit, comprising the steps of: forming a semiconductor element on a semiconductor substrate; and separating only a function layer including the semiconductor element, which is a surface layer of the semiconductor substrate, from the semiconductor substrate.

According to the above method for manufacturing a semiconductor integrated circuit, it becomes possible to form an integrated circuit by joining the semiconductor elements, which have been separated in the shape of micro tiles, to a freely chosen object. Here, the semiconductor element may be a compound semiconductor, or silicon semiconductor, and the object to which the semiconductor element is joined may be a silicon semiconductor substrate, a compound semiconductor substrate, or other substances. According to the present invention, it becomes possible to form a semiconductor element on a substrate having different material properties of the semiconductor element, such as the case where a GaAs VCSEL or photodiode is formed on a silicon semiconductor substrate. Also, since the semiconductor elements are separated in the shape of micro tiles after they are completed on the semiconductor substrate, it becomes possible to conduct a selection test on the semiconductor elements prior to forming an integrated circuit The present invention also provides a method for manufacturing a semiconductor integrated circuit, comprising the steps of: forming a semiconductor element on a semiconductor substrate; attaching a film member on a surface of the semiconductor substrate on which the semiconductor element is formed; and separating a function layer of the semiconductor substrate including the semiconductor element from the semiconductor substrate.

According to the above method for manufacturing a semiconductor integrated circuit, since only the functional layer including the semiconductor element may be separated from the semiconductor substrate in the shape of micro tiles, and they can be handled by mounting on the film member, it becomes possible to individually select the semiconductor elements to be joined to a final substrate, and to decrease the size of the semiconductor element that can be handled as compared with that of conventional mounting techniques.

In yet another aspect of the present invention, in the above method for manufacturing a semiconductor integrated circuit, it is preferable that the semiconductor element be a compound semiconductor device including at least one of a light emitting diode, a vertical cavity surface emitting laserdiode, a photodiode, a high electron mobility transistor, an inductor, a capacitor a resistor, and a heterojunction bipolar transistor.

Also, in yet another aspect of the present invention, in the above method for manufacturing a semiconductor integrated circuit, it is preferable that the semiconductor element be a silicon semiconductor device including at least one of an integrated circuit, a photodiode, a transistor, and a diode.

In yet another aspect of the present invention, the above method for manufacturing a semiconductor integrated circuit further includes the step of joining the functional layer attached to the film member onto a substrate made of silicon, quartz, sapphire, metals, ceramics, or plastic films.

According to the above method for manufacturing a semiconductor integrated circuit, since the semiconductor element is already formed on the functional layer, which is joined to the substrate, a complicated semiconductor process is not required after the joining process. Accordingly, it is not necessary to treat the entire substrate after the functional layer is joined to the substrate, and hence, it becomes possible to decrease unnecessary activity in the manufacturing process. Also, since it is not necessary to treat the entire substrate after the functional layer is joined to the substrate, restrictions in the joining methods are eased, and it becomes possible to adopt a low heat resistant joining method, for example.

In yet another aspect of the present invention, in the above method for manufacturing a semiconductor integrated circuit, the semiconductor substrate includes a sacrificial layer disposed below the functional layer, and the functional layer is separated from the semiconductor substrate by etching the sacrificial layer.

In yet another aspect of the present invention, in the above method for manufacturing a semiconductor integrated circuit, it is preferable that the semiconductor substrate include a gallium-arsenic compound semiconductor, and the sacrificial layer includes an aluminum-arsenic compound semiconductor, an aluminum-gallium-arsenic compound semiconductor, an indium-phosphorus compound semiconductor, or an indium-gallium-phosphorus compound semiconductor.

In yet another aspect of the present invention, in the above method for manufacturing a semiconductor integrated circuit, it is preferable that the semiconductor substrate be formed as a Silicon-On-Insulator substrate, and that the sacrificial layer include a silicon oxide membrane.

In yet another aspect of the present invention, it is preferable that the above method for manufacturing a semiconductor integrated circuit further include the step of: forming separation grooves on the semiconductor substrate, wherein the functional layer is separated from the semiconductor substrate by using the separation grooves and etching the sacrificial layer.

According to the above method for manufacturing a semiconductor integrated circuit, it becomes possible to utilize the whole surface area of the semiconductor substrate for the semiconductor element except the portion thereof corresponding to the separation grooves.

In yet another aspect of the present invention, in the above method for manufacturing a semiconductor integrated circuit, it is preferable that the separation groove be formed by using a dry etching process or wet etching process.

In yet another aspect of the present invention, in the above method for manufacturing a semiconductor integrated circuit, it is preferable that each of the separation grooves have a depth sufficient to reach at least the sacrificial layer.

According to the above method for manufacturing a semiconductor integrated circuit, it becomes possible to etch the sacrificial layer by introducing an etching solution to the separation grooves, and delivering the etching solution to the sacrificial layer from the separation grooves.

In yet another aspect of the present invention, in the above method for manufacturing a semiconductor integrated circuit, it is preferable that the sacrificial layer be etched using low concentration hydrochloric acid, hydrogen fluoride, or buffered hydrogen fluoride.

The present invention also provides a method for manufacturing a semiconductor integrated circuit, including the steps of: forming a semiconductor element on a semiconductor substrate, the semiconductor substrate including a sacrificial layer that may be removed by an etching process; forming separation grooves on the semiconductor substrate, each of the separation grooves having a depth sufficient to reach at least the sacrificial layer; attaching a film member on a surface of the semiconductor substrate; and separating the semiconductor element from the semiconductor substrate by supplying an etching solution to the separation grooves to etch the sacrificial layer.

In yet another aspect of the present invention, it is preferable that the above method for manufacturing a semiconductor integrated circuit further include the step of joining the semiconductor element attached to the film member to a substrate different from the semiconductor substrate.

In yet another aspect of the present invention, it is preferable that the above method for manufacturing a semiconductor integrated circuit further include the step of connecting the semiconductor element, which is joined to the substrate, to a circuit formed on the substrate.

The present invention also provides a semiconductor element member, including a semiconductor element; and a film member attached to the semiconductor element, wherein the semiconductor element member is produced by a method comprising the steps of: forming the semiconductor element on a semiconductor substrate; separating the semiconductor element from the semiconductor substrate; and attaching the film member onto the semiconductor element.

The present invention also provides a semiconductor integrated circuit including the above semiconductor element member, and a substrate, which is different from the semiconductor substrate used for forming the semiconductor element, on which the semiconductor element member is mounted, wherein the semiconductor element member is produced by a method comprising the steps of joining the semiconductor element member to the substrate, and connecting the semiconductor element to a circuit of the substrate.

The present invention also provides an electrooptic device including the above semiconductor integrated circuit.

The present invention also provides an electrooptic device including at least one of the functional layer produced by the above method, and the semiconductor element produced by the above method.

In yet another aspect of the present invention, it is preferable that the above electrooptic device further include a plurality of scan lines and data lines which are formed in a matrix; a switching device connected to the scan lines and data lines; and a pixel electrode connected to the switching device.

In yet another aspect of the present invention, it is preferable that the above electrooptic device further include a light emitting element.

The present invention also provides an electronic device including the above electrooptic device.

BRIEF DESCRIPTION OF THE DRAWINGS

Some of the features and advantages of the invention having been described, others will become apparent from the detailed description which follows, and from the accompanying drawings, in which.

DETAILED DESCRIPTION OF THE INVENTION

The invention summarized above and defined by the enumerated claims may be better understood by referring to the following detailed description, which should be read with reference to the accompanying diagrams. This detailed description of particular preferred embodiments, set out below to enable one to build and use one particular implementation of the invention, is not intended to limit the enumerated claims, but to serve as specific examples thereof.

Hereinafter, a method for manufacturing a semiconductor integrated circuit according to an embodiment of the present invention will be described with reference to FIGS. 1 to 10. Although explanation will be made for the case in which a compound semiconductor device (compound semiconductor element) is joined onto a silicon-LSI chip in the first embodiment according to the present invention, the present invention may be applied regardless of the kind of semiconductor device and the LSI chip. Note that the term "semiconductor substrate" used in the embodiments of the present invention means an object made of a semiconductor material. The shape of the semiconductor substrate is not particularly limited, and a semiconductor material having other than a plate shape is included in the "semiconductor substrate".

First Embodiment

Figure 1:
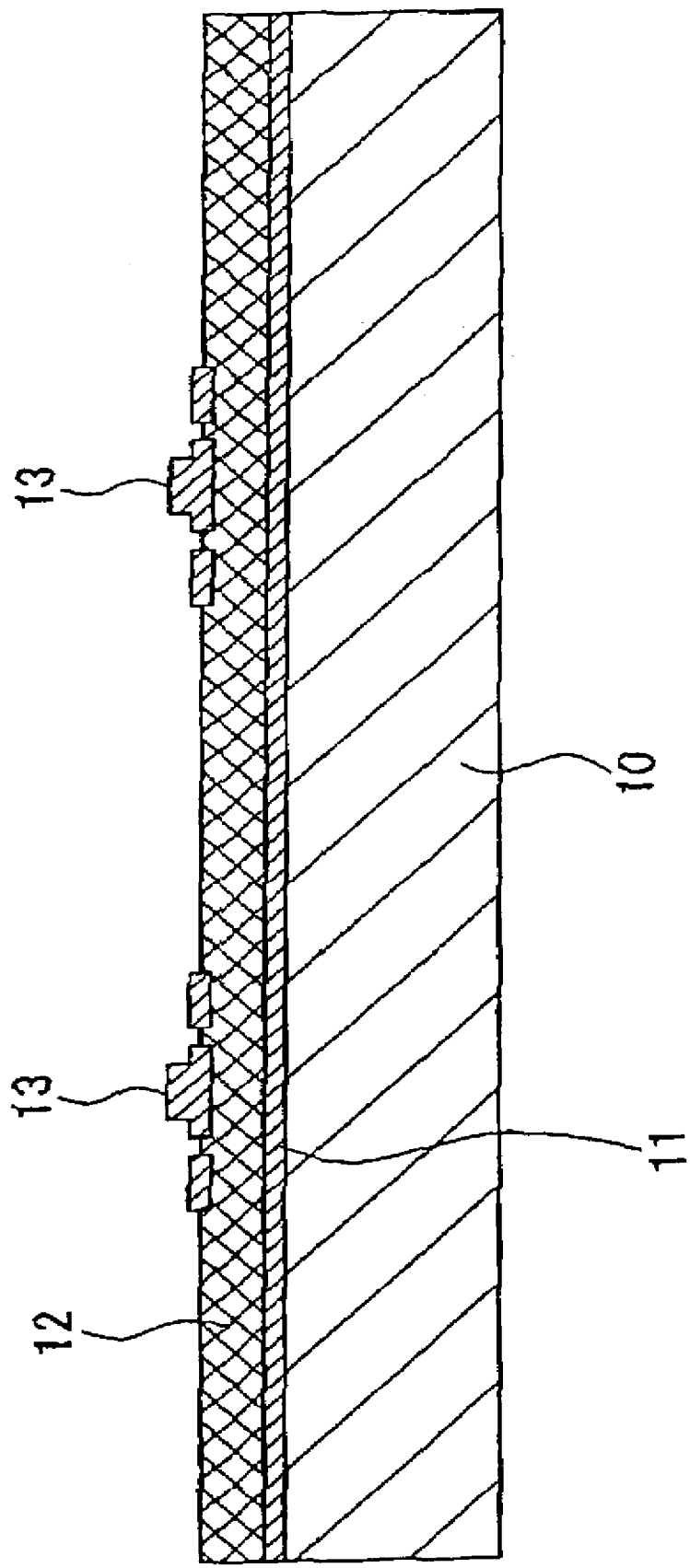
FIG. 1 is a diagram showing a schematic cross-sectional view showing the first step of a method for manufacturing a semiconductor integrated circuit according to the first embodiment of the present invention.

First Step:

FIG. 1 is a diagram showing a schematic cross-sectional view for explaining the first step of a method for manufacturing a semiconductor integrated circuit according to the embodiment of the present invention. In FIG. 1, a substrate 10 is a semiconductor substrate, and in this embodiment, the substrate 10 is a GaAs compound semiconductor substrate. A sacrificial layer 11 is disposed as the lowest layer in the substrate 10. The sacrificial layer 11 is made of aluminum-arsenic (AlAs) and has a thickness of about several hundred nm, for example.

A functional layer 12 may be disposed on the sacrificial layer 11. The thickness of the functional layer 12 is, for instance, between about 1 to 20 µm. A semiconductor device (semiconductor element) 13 is formed on the functional layer 12. Examples of the semiconductor device 13 include, for instance, a light emitting diode (LED), a vertical cavity surface emitting laserdiode (VCSEL), a photodiode (PD), a high electron mobility transistor (HEMT), and a high electron mobility transistor (HEMT). In all of these semiconductor devices 13, a semiconductor element is formed by laminating a plurality of epitaxial layers on the substrate 10. Also, electrodes are attached to each of the semiconductor devices 13 and operation tests are performed.

Figure 2:
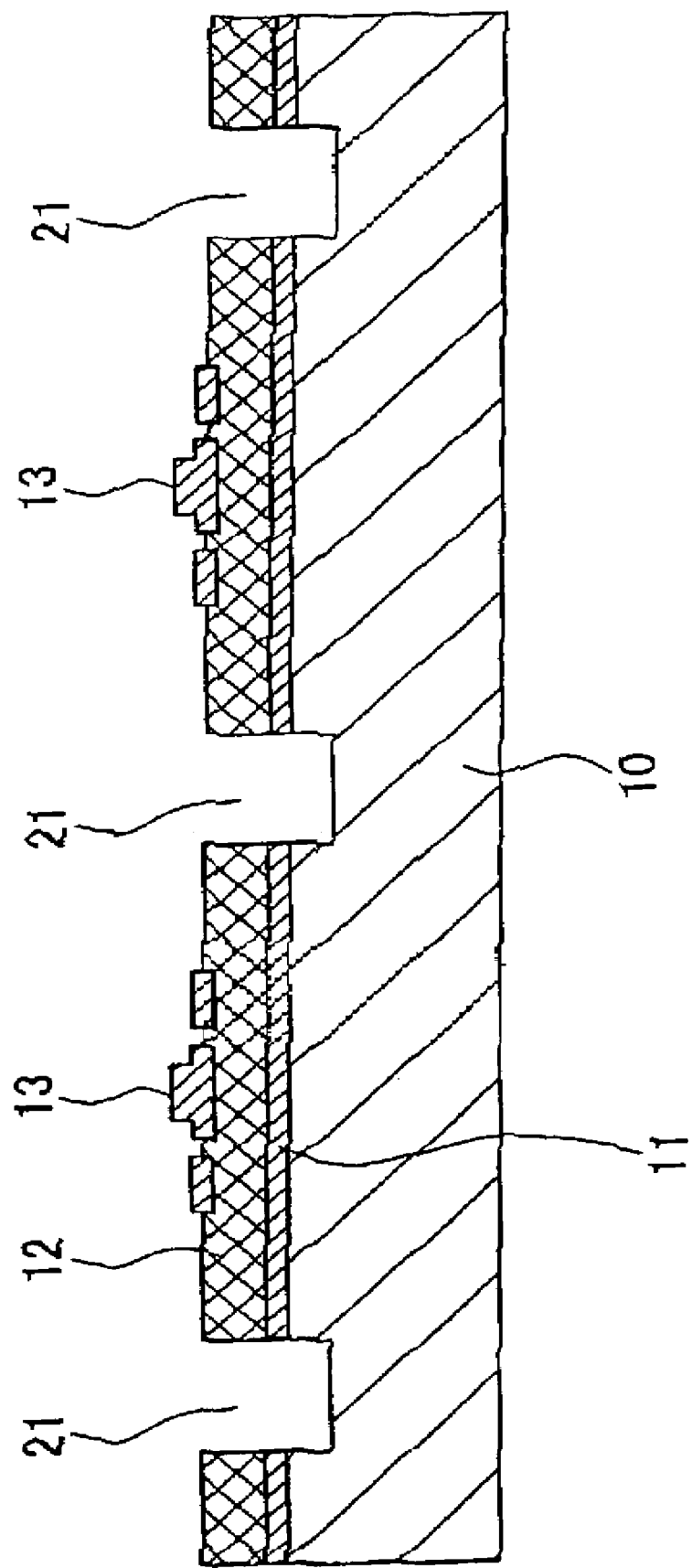
FIG. 2 is a diagram showing a schematic cross-sectional view showing the second step of a method for manufacturing a semiconductor integrated circuit according to the first embodiment of the present invention.

Second Step:

FIG. 2 is a diagram showing a schematic cross-sectional view for explaining the second step of the method for manufacturing a semiconductor integrated circuit according to the embodiment of the present invention. In his step, separation grooves 21 are formed so as to divide each of the semiconductor devices 13. Each separation groove 21 has a depth deep enough to reach at least the sacrificial layer 11. Both the width and depth of the separation groove 21 may be, for instance, in the range of about 10 to several hundred µm. Also, the separation grooves 21 are connected to each other so that a selective etching solution, which will be described later, will flow in the separation grooves 21. Moreover, it is preferable that the separation grooves 21 be formed in a grid.

Also, the distance between the separation grooves 21 is adjusted to be about several tens to several hundred µm so that each of the semiconductor devices 21 divided and separated by the separation grooves 21 have a size of about several tens to several hundred µm². The separation grooves 21 may be formed using a photolithography method combined with a wet etching method, or a dry etching method. Moreover, the separation grooves 21 may also be formed by dicing of a U-shape groove as long as no cracks are generated on the substrate.

In the formation of the separation grooves 21, a sulfuric acid type etching solution may be used for wet etching, and a chlorine gas may be used for dry etching. Since the pattern dimension of the separation groove 21 is large and accuracy is not very important, etching masks need not be formed using the photolithography. That is, the etching masks may be formed using, for instance, the offset printing. In the formation of the separation grooves 21, the direction of the separation grooves 21 with respect to the crystal orientation of the substrate 10 is important.

Figure 3:
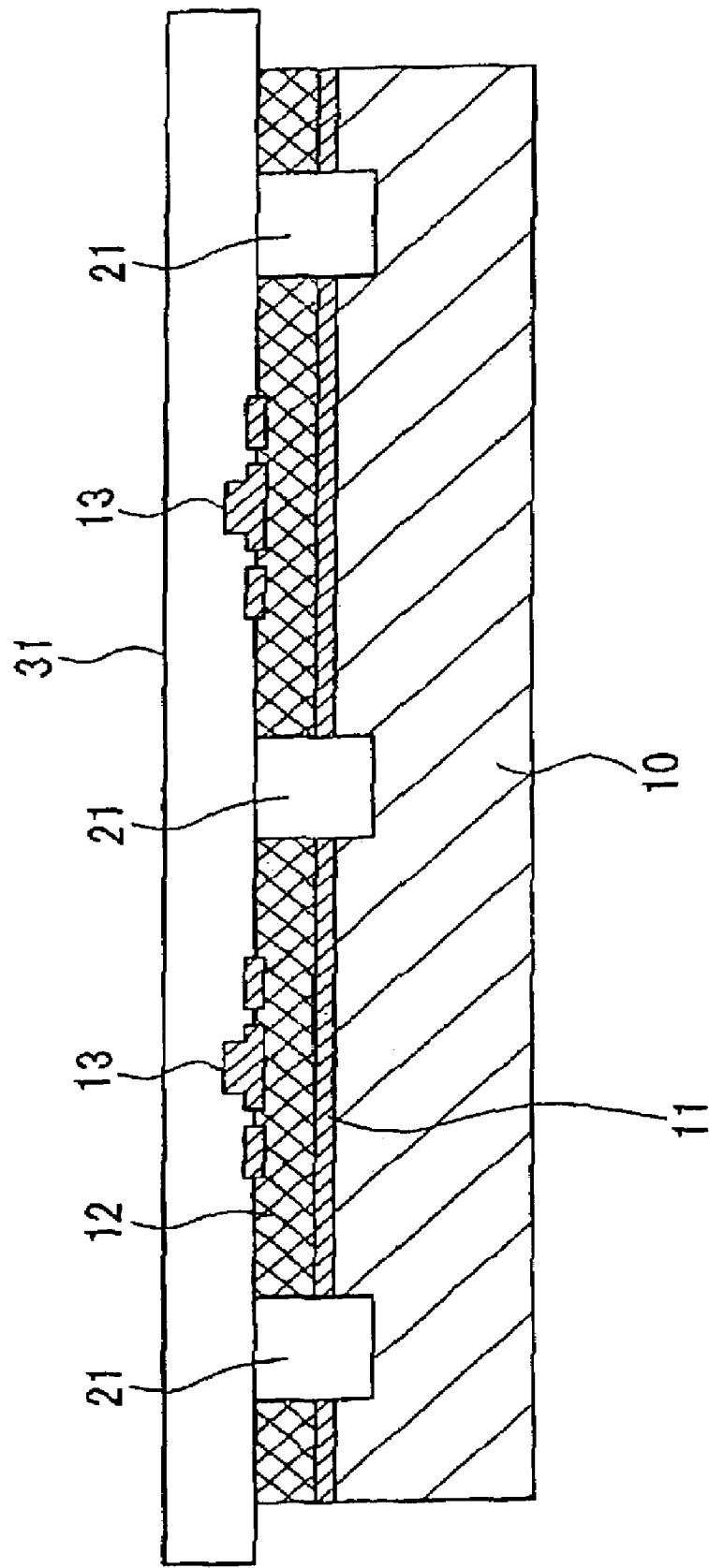
FIG. 3 is a diagram showing a schematic cross-sectional view showing the third step of a method for manufacturing a semiconductor integrated circuit according to the first embodiment of the present invention.

Third Step:

FIG. 3 is a diagram showing a schematic cross-sectional view for explaining the third step of the method for manufacturing a semiconductor integrated circuit according to the embodiment of the present invention. In this step, an intermediate transfer film 31 is attached to a surface (the semiconductor device 13 side) of the substrate 10. The intermediate transfer film 31 is a flexible band-shape film, the surface of which is coated with an adhesive.

Figure 4:
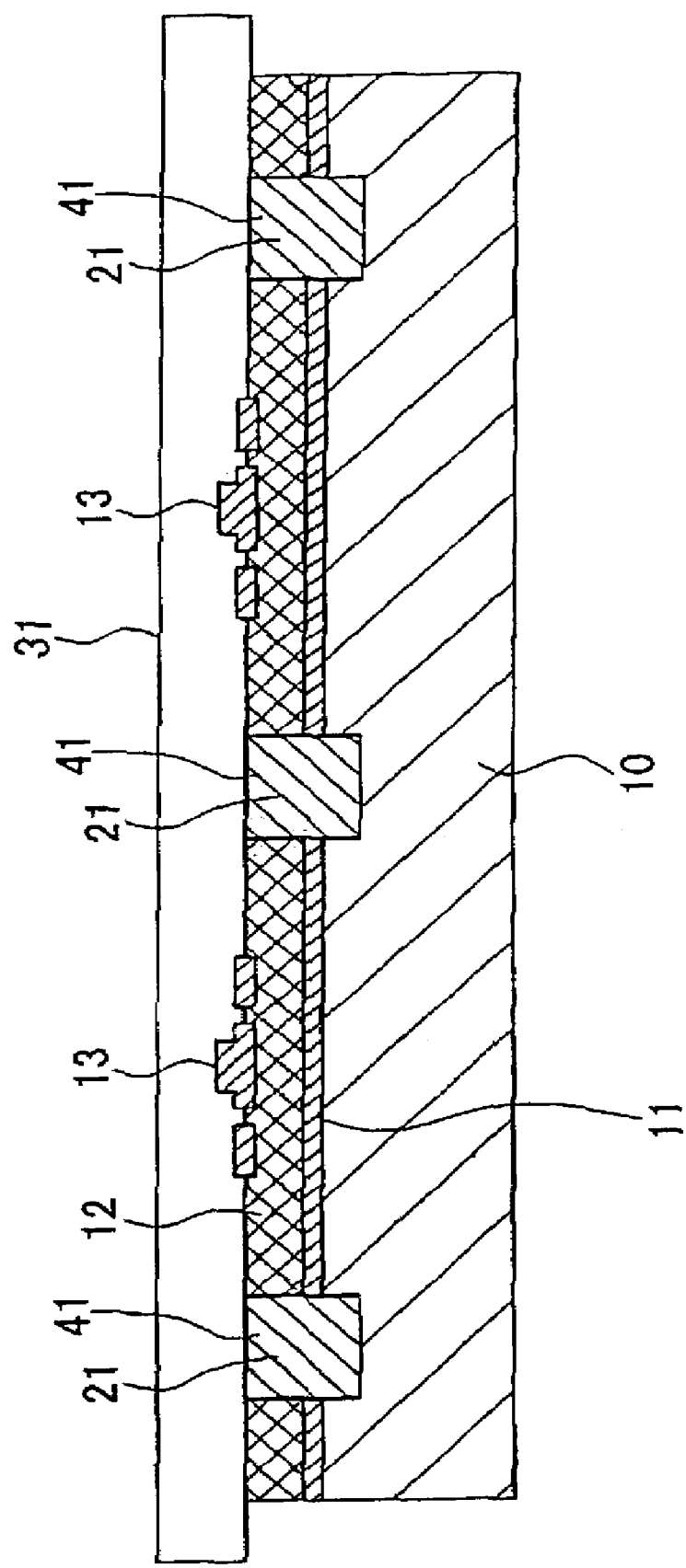
FIG. 4 is a diagram showing a schematic cross-sectional view showing the fourth step of a method for manufacturing a semiconductor integrated circuit according to the first embodiment of the present invention.

Fourth Step:

FIG. 4 is a diagram showing a schematic cross-sectional view for explaining the fourth step of the method for manufacturing a semiconductor integrated circuit according to the embodiment of the present invention. In this step, a selective etching solution 41 is filled in the separation grooves 21. In order to selectively etch only the sacrificial layer 11, low concentration hydrochloric acid having high selectivity to aluminum-arsenic is used as the selective etching solution 41. Although it is possible to use low concentration hydrogen fluoride as the selective etching solution 41, it is preferable to use hydrochloric acid from the viewpoint of selectivity.

Figure 5:
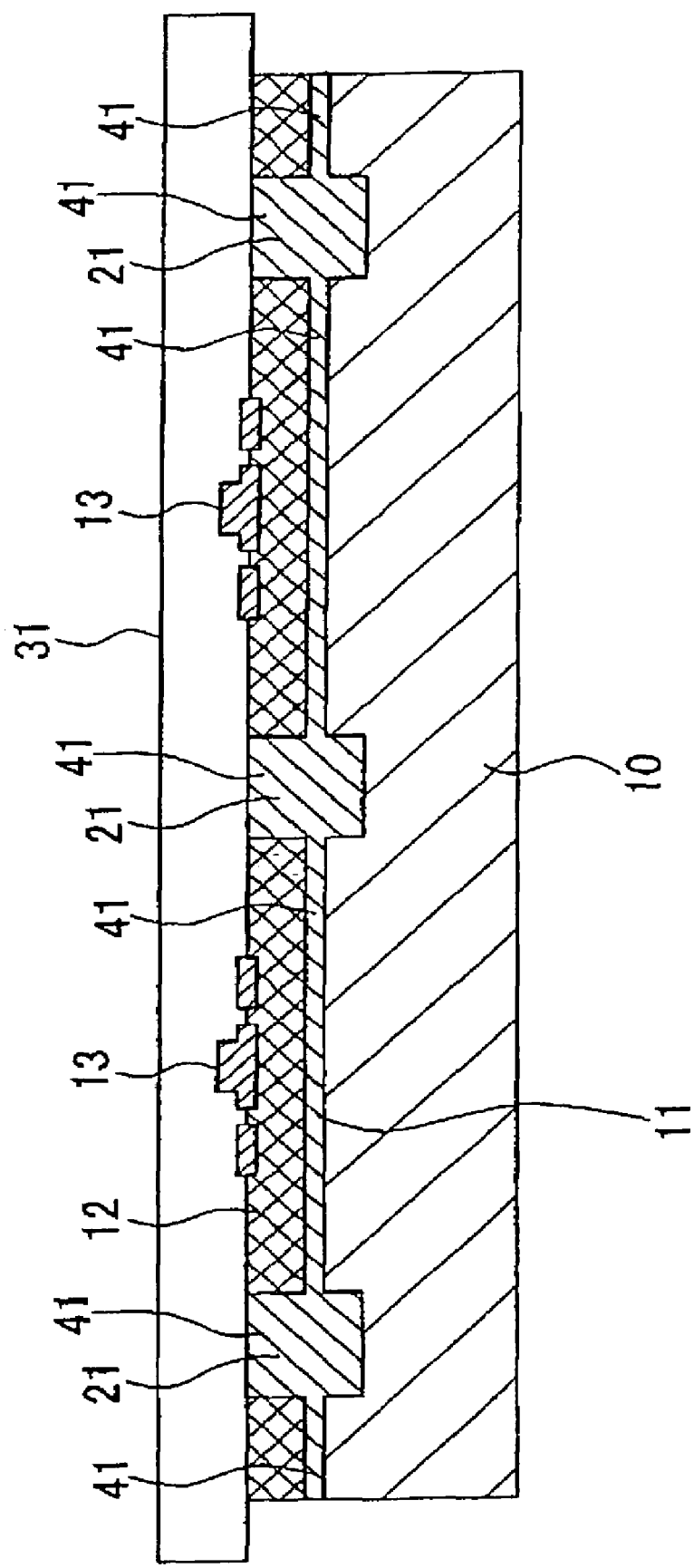
FIG. 5 is a diagram showing a schematic cross-sectional view showing the fifth step of a method for manufacturing a semiconductor integrated circuit according to the first embodiment of the present invention.

Fifth Step:

FIG. 5 is a diagram showing a schematic cross-sectional view for explaining the fifth step of the method for manufacturing a semiconductor integrated circuit according to the embodiment of the present invention. In this step, after a predetermined period of time has elapsed since the application of the selective etching solution 41 to the separation grooves 21 in the fourth step, the whole sacrificial layer 11 is removed from the substrate 10 using the selective etching process. After this, pure water is introduced to the portions where the separation grooves 32 and the sacrificial layer 11 were present to rinse the portions.

Figure 6:
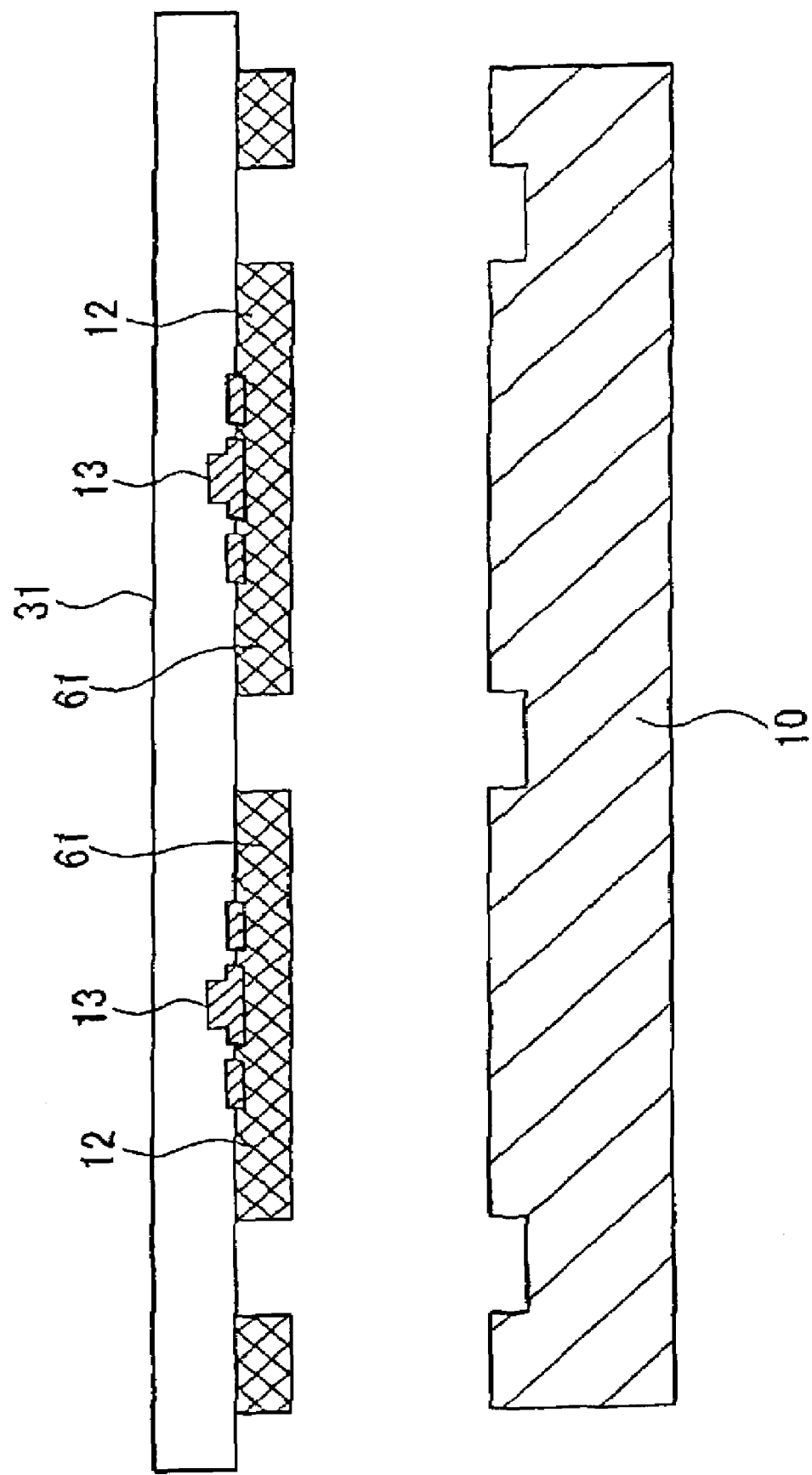
FIG. 6 is a diagram showing a schematic cross-sectional view showing the sixth step of a method for manufacturing a semiconductor integrated circuit according to the first embodiment of the present invention.

Sixth Step:

FIG. 6 is a diagram showing a schematic cross-sectional view for explaining the sixth step of the method for manufacturing a semiconductor integrated circuit according to the embodiment of the present invention. When all of the sacrificial layers 11 are etched in the fifth step, the functional layers 12 are separated from the substrate 10. In this step, the functional layers 12 attached to the intermediate transfer film 31 are separated from the substrate 10 by separating the intermediate transfer film 31 from the substrate 10.

In this manner, the functional layers 12 on which the semiconductor devices 13 are formed are separated by the formation of the separation grooves 21 and the etching of the sacrificial layer 11 to be formed as a semiconductor element of a predetermined shape, for instance, a micro tile shape, which will also be referred to as a micro tile element 61 hereinafter, and are attached and supported by the intermediate transfer film 31. Here, it is preferable that the thickness of the functional layer be in the range of about 1 to 8 µm, and the dimensions (i.e., length and width) thereof be in the range of about several tens to several hundred µm, for instance.

Also, it is possible to recycle the substrate 10, from which the functional layers 12 are separated, for the formation of another semiconductor device. Moreover, the above-mentioned first to sixth steps may be repeated by providing a plurality of the sacrificial layers 11 in advance, and hence, the micro tile elements 61 may be repeatedly produced.

Figure 7:
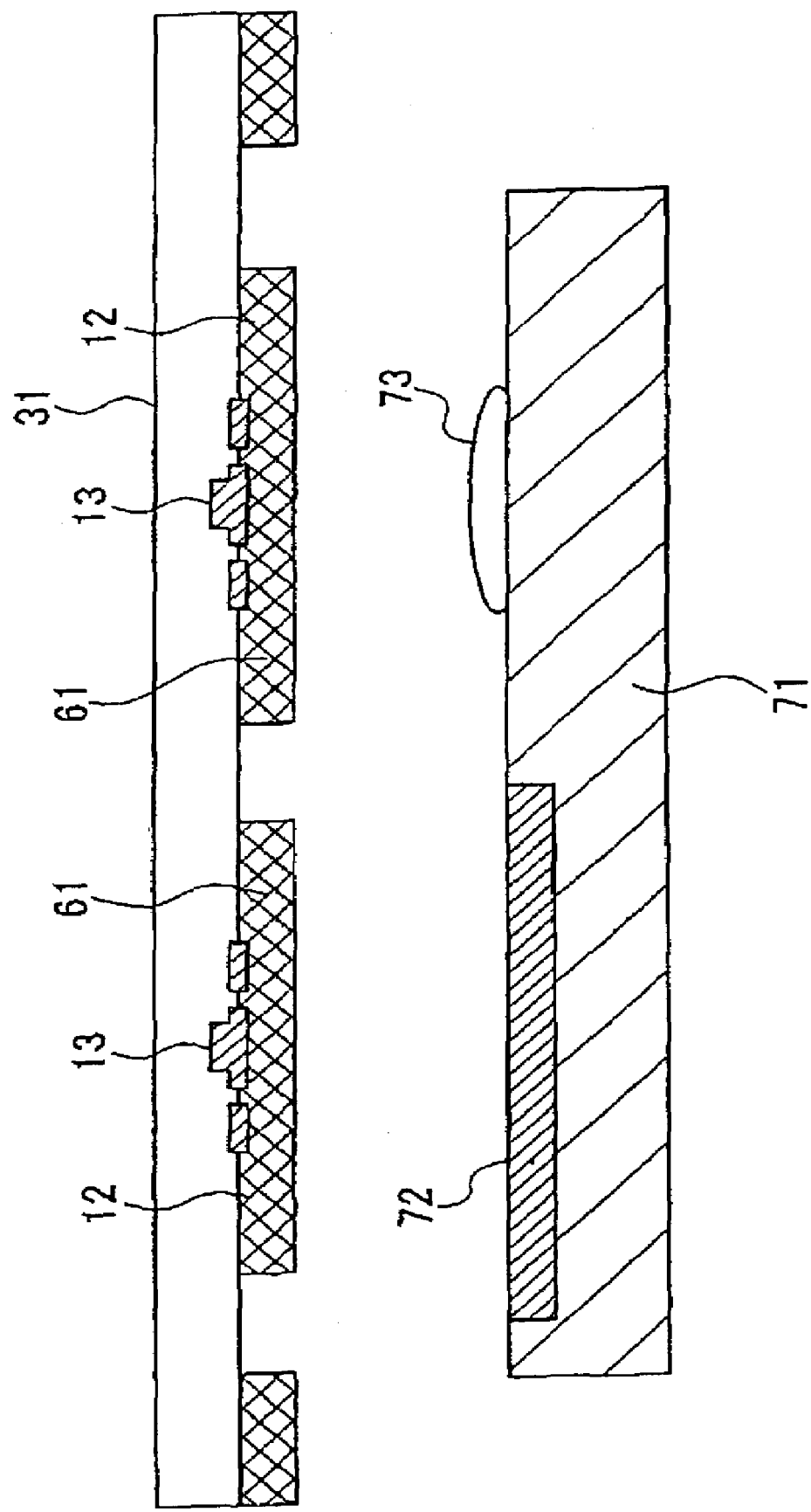
FIG. 7 is a diagram showing a schematic cross-sectional view showing the seventh step of a method for manufacturing a semiconductor integrated circuit according to the first embodiment of the present invention.

Seventh Step:

FIG. 7 is a diagram showing a schematic cross-sectional view for explaining the seventh step of the method for manufacturing a semiconductor integrated circuit according to the embodiment of the present invention. In this step, the micro tile elements 61 are aligned at desired positions on a final substrate 71 by transferring the intermediate transfer film 31 to which the micro tile elements 61 are attached. Here, the final substrate 71 is made of a silicon semiconductor, and an LSI area 72 has been provided with the final substrate 71. Also, an adhesive 73 for adhering the micro tile elements 61 is applied to desired positions on the final substrate 71.

Figure 8:
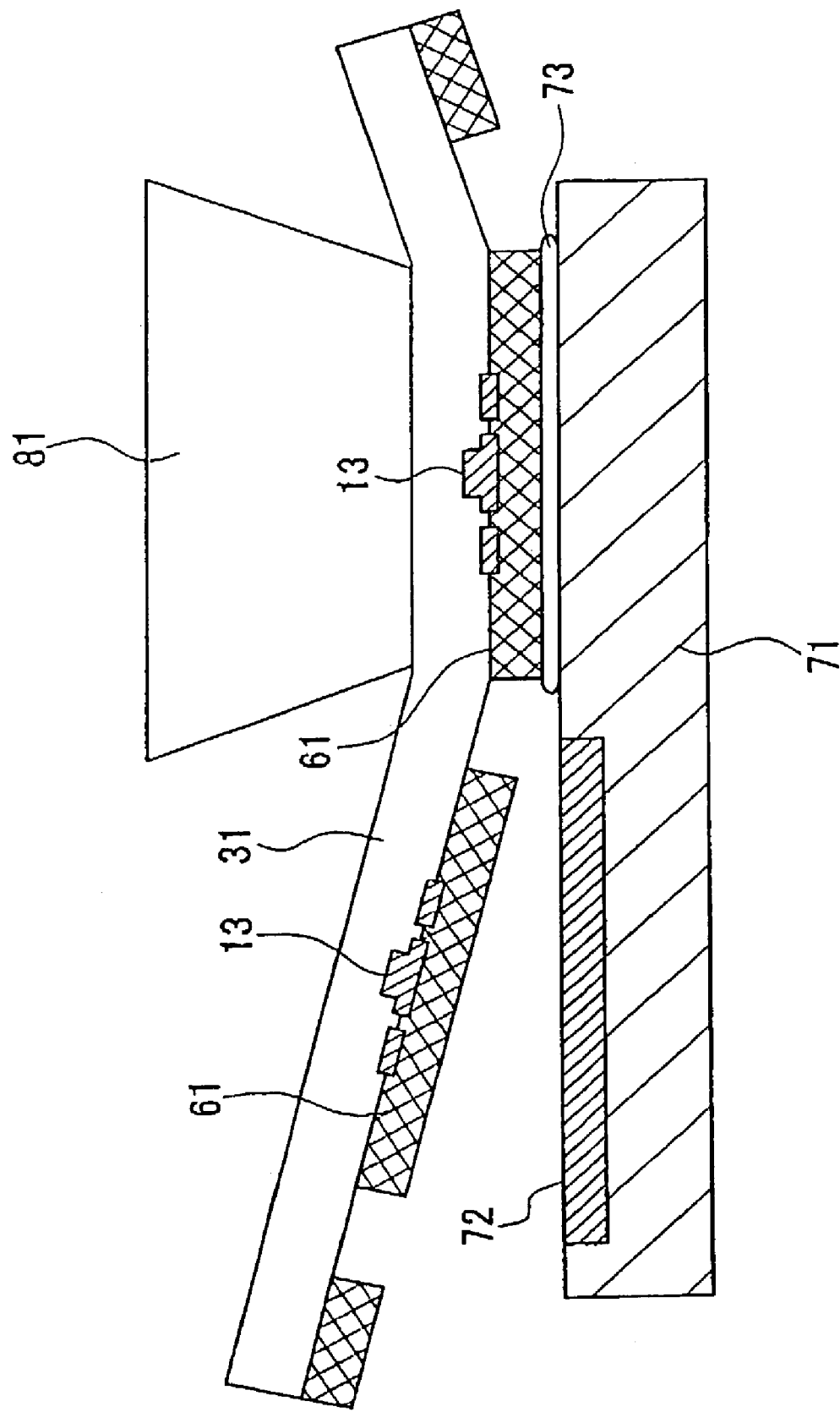
FIG. 8 is a diagram showing a schematic cross-sectional view showing the eighth step of a method for manufacturing a semiconductor integrated circuit according to the first embodiment of the present invention.

Eighth Step:

FIG. 8 is a diagram showing a schematic cross-sectional view for explaining the eighth step of the method for manufacturing a semiconductor integrated circuit according to the embodiment of the present invention. In this step, the micro tile elements 61, which have been aligned at desired positions on the final substrate 71, are pressed against the final substrate 71 via the intermediate transfer film 31 using a collet 81 so that the micro tile elements 61 are joined to the final substrate 71. Here, since the adhesive 73 is applied to the desired positions on the final substrate 71, the micro tile elements 61 are attached to the desired positions on the final substrate 71. Note that although the adhesive is used as a means for adhering the micro tile elements 61 on the final substrate 71, it is possible to use other adhering means.

Figure 9:
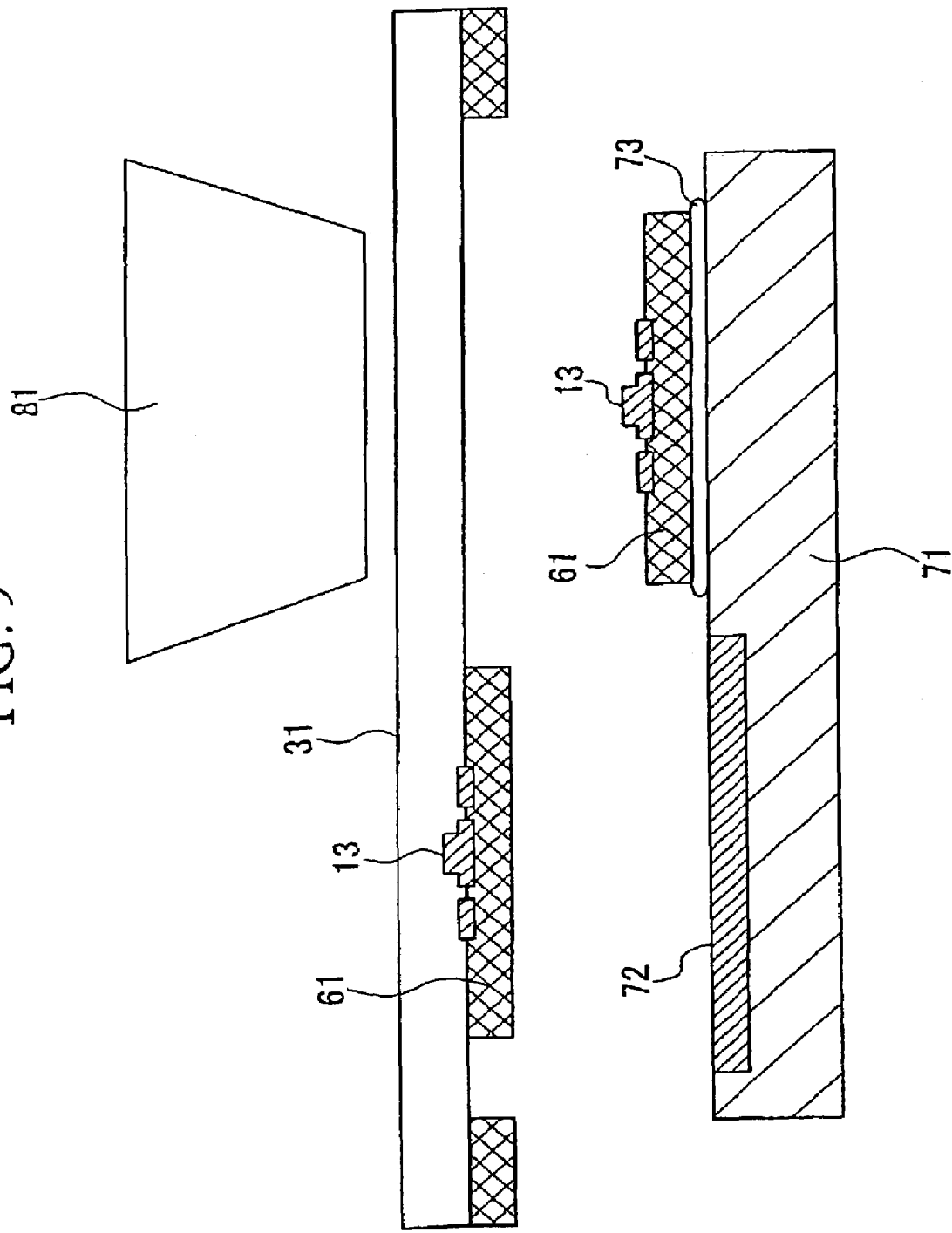
FIG. 9 is a diagram showing a schematic cross-sectional view showing the ninth step of a method for manufacturing a semiconductor integrated circuit according to the first embodiment of the present invention.

Ninth Step:

FIG. 9 is a diagram showing a schematic cross-sectional view for explaining the ninth step of the method for manufacturing a semiconductor integrated circuit according to the embodiment of the present invention. In this step, the intermediate transfer film 31 is separated from the micro tile elements 61 by eliminating the adhesive power from the intermediate transfer film 31.

A UV curable adhesive or a thermosetting adhesive may be used for the adhesive on the intermediate transfer film 31. When the UV curable adhesive is used, the collet 81 is made of a transparent material so that the adhesive power of the intermediate transfer film 31 may be eliminated by irradiating ultraviolet (UV) rays from an end of the collet 81. When the thermosetting adhesive is used, it is sufficient to heat the collet 81 to eliminate the adhesive power. Also, it is possible to eliminate the adhesive power of the intermediate transfer film 31 by irradiating the entire surface of the transfer film 31 using the ultraviolet rays after the sixth step. After the elimination process, the adhesive power still slightly remains and the micro tile elements 61 can be supported by the intermediate transfer film 31 since the elements 61 are very thin and light.

Tenth step:

This process is not shown in the figure. In this step, the micro tile elements 61 are firmly joined to the final substrate 71 by subjecting them to a heating process, etc.

Figure 10:
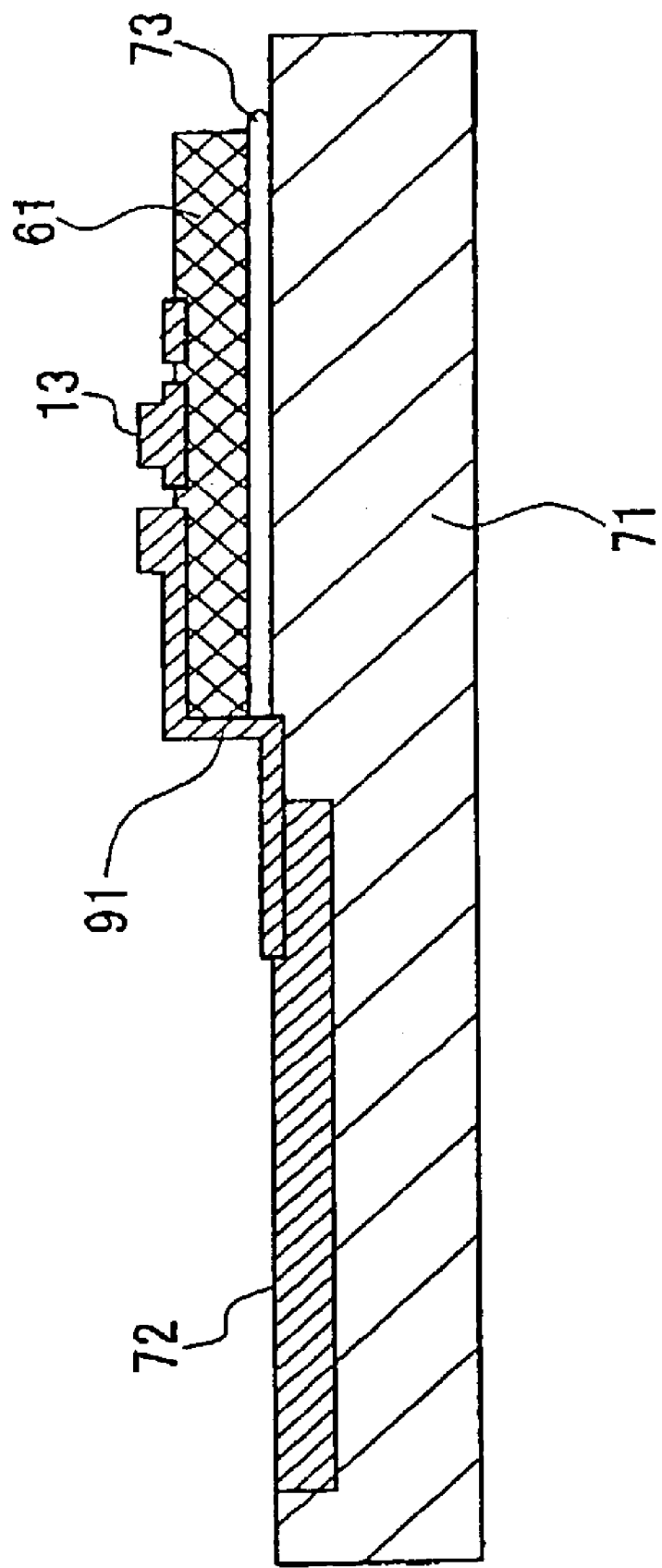
FIG. 10 is a diagram showing a schematic cross-sectional view showing the eleventh step of a method for manufacturing a semiconductor integrated circuit according to the first embodiment of the present invention.

Eleventh Step:

FIG. 10 is a diagram showing a schematic cross-sectional view for explaining the eleventh step of the method for manufacturing a semiconductor integrated circuit according to the embodiment of the present invention. In this step, the electrodes of the micro tile elements 61 are electrically connected to the circuit on the final substrate 71 via wiring 91 to form a LSI chip.

As the final substrate 71, not only the silicon semiconductor but also a quartz substrate or a plastic film may be applied. When the silicon semiconductor is applied as the final substrate 71, it is possible to make it a substrate having a charge coupled device (CCD). When a glass substrate, such as one of quartz, is applied as the final substrate 71, it may be used for liquid crystal displays (LCDs) or organic electroluminescent displays. Also, when the plastic film is applied as the final substrate 71, this may be used for LCDs, organic electroluminescent panels, or IC film packages.

Second Embodiment

Next, in the second embodiment of the present invention, the case in which a silicon transistor (a silicon semiconductor element) is attached to a glass substrate for liquid crystal will be explained. The first to eleventh steps of the second embodiment correspond to the first to eleventh steps of the first embodiment. The significant difference between the first and second embodiments is that the method used for selectively etching the sacrificial layer in the fourth step is different.

In the first step of the second embodiment, a silicon transistor is formed on a silicon-on-insulator (SOI) substrate using an ordinary process. Here, it is possible to form an integrated circuit which is a silicon device, a photodiode, a transistor, or a diode instead of the silicon transistor. A silicon oxide membrane which becomes a sacrificial layer is provided with the SOI substrate.

In the second step, separation grooves are formed on the SOI substrate. Each separation groove has a depth deep enough to reach at least the silicon oxide membrane which becomes the sacrificial layer in the SOI substrate. The separation grooves may be formed using a method, such as an etching.

In the third step, an intermediate transfer film is attached to a surface (the silicon transistor side) of the SOI substrate.

In the fourth step, hydrogen fluoride is introduced to the separation groove in order to selectively etch only the silicon oxide membrane which forms the sacrificial layer.

In the fifth step, after a predetermined period of time has elapsed since the completion of the fourth step, the sacrificial layer made of the silicon oxide membrane is etched to separate the silicon transistor (silicon semiconductor element) from the silicon substrate.

In the sixth step, the silicon transistor attached to the intermediate transfer film is separated from the SOI substrate by separating the intermediate transfer film from the SOI substrate.

In the seventh step, the silicon transistors are aligned at desired positions on the final substrate by moving the intermediate transfer film. Here, a glass substrate for liquid crystal is used as the final substrate.

In the eighth step, the silicon transistors aligned at desired positions on the final substrate are joined to the final substrate by pressing against the final substrate via the intermediate transfer film using a collet. Here, since an adhesive has been applied to the desired positions, each of the silicon transistors is adhered to the desired position on the final substrate.

In the ninth step, the adhesive power of the intermediate transfer film is eliminated to separate the intermediate transfer film from the silicon transistor.

In the tenth step, the silicon transistor is completely joined to the final substrate by subjecting the transistor to a heating process, and so forth.

In the eleventh step, the electrodes of the transistor are connected to the circuit on the final substrate via wiring to form the glass substrate for liquid crystal, a driving circuit therefor, and so forth.

Note that techniques used in the fifth to eleventh steps of the first embodiment of the present invention may also be used for the fifth to eleventh steps of the second embodiment.

According to the method for manufacturing semiconductor integrated circuit of the first and second embodiments of the present invention, it becomes possible to monolithically form a semiconductor element on a semiconductor substrate, which is difficult by using a conventional monolithical manufacturing process.

Figure 18:
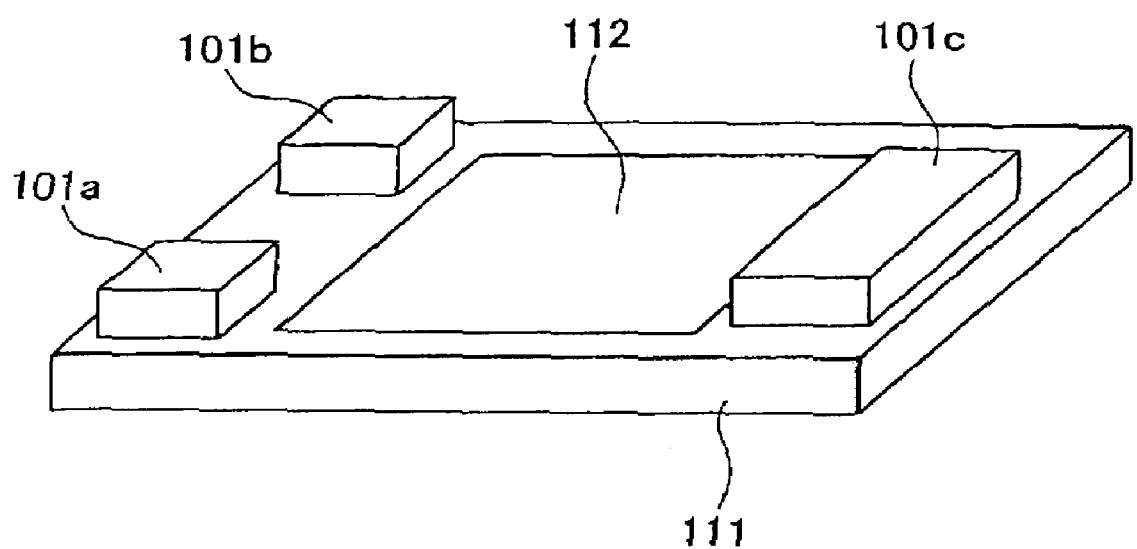
FIG. 18 is a diagram showing a schematic perspective view of an example of conventional hybrid integrated circuits.

In order to form a semiconductor element on a substrate having different material properties, such as for the case where a vertical cavity surface emitting laserdiode (VCSEL), a photodiode (PD), or a high electron mobility transistor (HEMT) made of AgAs is formed on a silicon semiconductor substrate, and a micro-silicon transistor, instead of a thin film transistor (TFT) of each pixel of a liquid crystal display (LCD), is attached onto a glass substrate, a hybrid process has been conventionally used. FIG. 18 is a diagram showing a schematic perspective view of an example of conventional hybrid integrated circuits. In this figure, a silicon LSI chip 111 includes a LSI area 112. A photodiode chip 101a, a VCSEL chip 101b, and a HEMT chip 101c are joined to the surface of the silicon LSI chip 111. Here, the limit in size of the chip that can be handled using the conventional mounting techniques is thickness of several tens μm×surface area of several hundreds μm². Accordingly, the size of the photodiode chip 101a, the VCSEL chip 101b, and the HEMT chip 101c become greater than the thickness of several tens μm×surface area of several hundreds μm².

Figure 11:
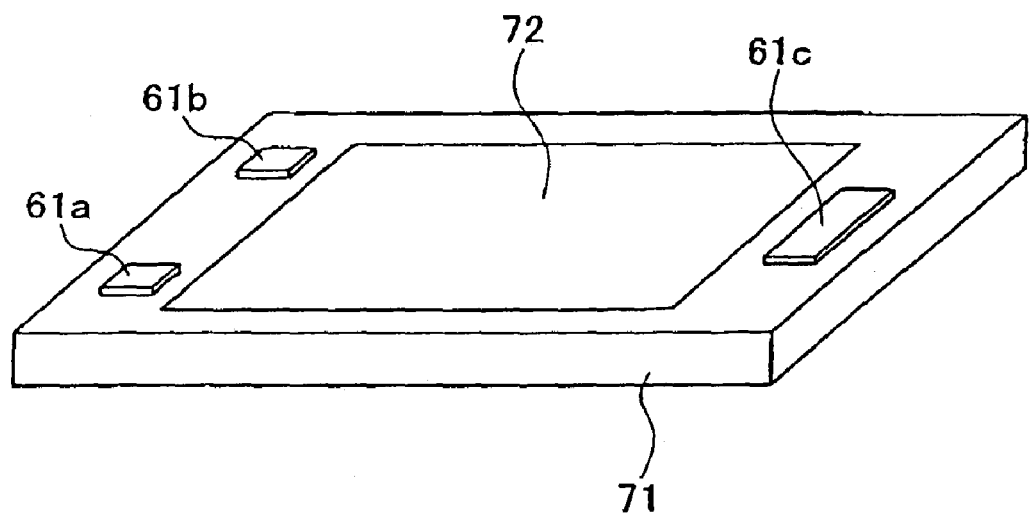
FIG. 11 is a diagram showing a schematic perspective view of an embodiment of an integrated circuit produced by the manufacturing method according to the present invention.

FIG. 11 is a schematic perspective view showing an example of the integrated circuits which are manufactured by using the method for manufacturing the semiconductor integrated circuit according to an embodiment of the present invention. In the figure, the silicon LSI chip, which is the final substrate 71, includes the LSI area 72. A photodiode tile 61a, a VCSEL tile 61b, and a high performance transistor tiles 61c (including MESFET, HBT, and HEMT) are joined to the surface of the final substrate 71. Note that the HBT means a compound semiconductor heterojunction bipolar transistor. Here, the photodiode tile 61a, the VCSEL tile 61b, and the high performance transistor tile 61c are manufactured as the micro tile elements 61 and are joined using the manufacturing method according to the first embodiment of the present invention. Accordingly, it is possible to realize the dimensions (thickness of several μm×surface area of several tens of μm²) for the photodiode tile 61a, the VCSEL tile 61b, and the high performance transistor 61c.

That is, according to the manufacturing method of the present invention, it becomes possible to form a semiconductor element (i.e., the micro tile element 61) which is as small as one monolithically manufactured, on an arbitrary kind of substrate, such as silicon, quartz, sapphire, metals, ceramics, and plastic films.

Also, according to the above-mentioned first and second embodiments of the manufacturing method of the present invention, a test can be performed on a semiconductor element in advance and the semiconductor may be selected based on the result of the test since the semiconductor element (the semiconductor device 13) is processed to be the micro tile element 61 after the semiconductor element is formed on the semiconductor substrate (the substrate 10).

Moreover, according to the above-mentioned first and second embodiments of the manufacturing method of the present invention, the whole semiconductor substrate (the substrate 10) from which the micro tile elements 61 are produced, can be used for the semiconductor devices 13 except the portion that is used for the separation grooves. Accordingly, it becomes possible to increase the efficiency in using the area of the semiconductor substrate (the substrate 10), and to reduce the manufacturing cost.

Furthermore, according to the above-mentioned first and second embodiments of the manufacturing method of the present invention, since the micro tile elements 61 are mounted on the flexible intermediate transfer film 31, each of the micro tile elements 61 may be selected and joined to the final substrate 71.

In addition, according to the above-mentioned first and second embodiments of the manufacturing method of the present invention, since the micro tile elements 61 are joined to the final substrate 71 in a completed state as a semiconductor element, a complicated semiconductor process is not required after the joining process. Accordingly, it is not necessary to treat the whole final substrate 71 after the micro tile elements 61 are joined to the final substrate 71, and hence, it becomes possible to reduce the unnecessary activity in the manufacturing process.

Also, since a complicated semiconductor process is not required after the micro tile elements 61 are joined to the final substrate 71, restrictions in the methods for joining the micro tile elements 61 to the substrate are eased, and it becomes possible to adopt a low heat resistant joining method, for example.

Practical Embodiments:

Hereinafter, examples of applications of a semiconductor element member which is manufactured by using the manufacturing method for the semiconductor integrated circuit according to the present invention will be explained.

In the first practical embodiment, a vertical cavity surface emitting laserdiode (VCSEL) and a photodiode (PD) are disposed on a silicon LSI using the above method according to the first embodiment of the present invention. In this manner, it becomes possible to transmit data to the outside of the silicon LSI using optical pulses. Accordingly, it becomes possible not only to transmit data to a place where electrical connection is not possible but also to transmit data at higher speed than the case where data are transmitted using electrical signals.

In the second practical embodiment, a high performance transistor (e.g. HBT) is disposed on a silicon LSI using the above method according to the first embodiment of the present invention. By integrating a high performance analog amplifier using the HBT in a silicon IC as a component of a mobile phone, for instance, the length of wiring can be shortened, and hence, high performance of the circuits can be realized. Also, the whole semiconductor substrate (the substrate 10) from which the micro tile elements 61 are produced, can be used as the semiconductor devices 13 except the portion that is used for the separation grooves 21. Accordingly, it becomes possible to increase the efficiency in using the area of the AgAs substrate, which is expensive, and to reduce the manufacturing cost.

In the third practical embodiment, as each pixel of a liquid crystal display, which is an electrooptic device, a micro-silicon transistor, instead of a thin film transistor (TFT), is attached using the manufacturing method according to the present invention. That is, the silicon transistors are attached to a glass substrate for liquid crystal by using the above-mentioned method according to the second embodiment of the present invention. In this manner, it becomes possible to obtain a switching function, the performance of which is better compared to the case where the TFT is employed. Since the proportion of the area of the transistor in a pixel of a liquid crystal display is only a few percent, the rest of the pixel area other than the TFT area becomes useless if the entire surface of the pixel is formed using a TFT process. By using the manufacturing method according to the second embodiment of the present invention explained above, on the other hand, it becomes possible to minimize the useless area by densely forming the micro silicon transistors on a silicon substrate, dividing the transistors using the separation layers and the sacrificial layers, and attaching the transistors only to necessary portions. Accordingly, the manufacturing cost can be significantly reduced.

In the fourth practical embodiment, as each pixel of an organic electroluminescent device, which is an electrooptic device, a micro-silicon transistor, instead of a thin film transistor (TFT), is attached using the manufacturing method according to the present invention. Hereinafter, the manufacturing method of this electrooptic device will be explained in detail.

Figure 12:
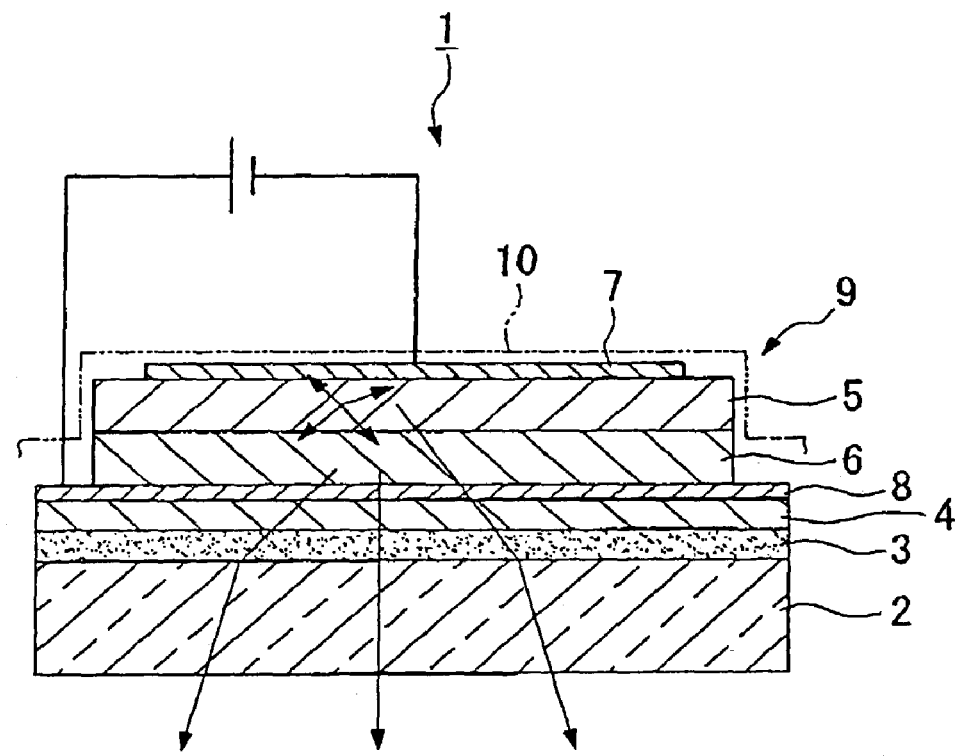
FIG. 12 is a diagram showing a schematic cross-sectional view of an electrooptic device according to the embodiment of the present invention.

Electrooptic Device:

Hereinafter, the electrooptic devices according to the practical embodiments of the present invention will be explained with reference to FIGS. 12 and 13. FIG. 12 is a diagram showing a cross-sectional view of an example of the electroluminescent devices which is an electrooptic device according to the embodiment of the present invention.

In FIG. 12, an organic electroluminescent device 1 includes an optically transparent substrate (light permeable layer) 2, and an organic electroluminescent element (light emitting element) 9 including a light emitting layer 5 and a positive hole transporting layer 6. The light emitting layer 5 is disposed between a pair of electrodes (a cathode 7 and an anode 8) and is made of an organic electroluminescent material. A low refractive index layer 3, and a sealing layer 4 may be laminated between the substrate 2 and the organic electroluminescent element 9. The low refractive index layer 3 is disposed closer to the substrate 2 as compared to the sealing layer 4.

Figure 13:
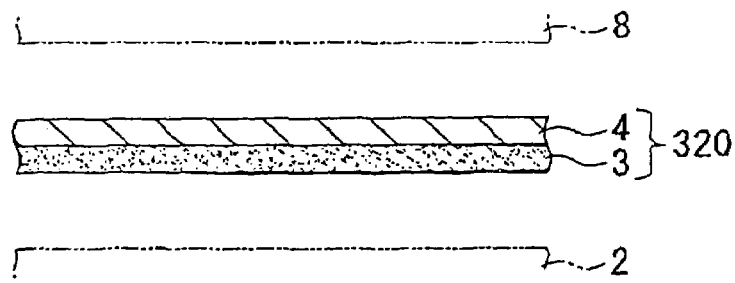
FIG. 13 is a diagram showing a cross-sectional view of a membranous member of the electrooptic device.

Also, in the organic electroluminescent device 1, a sealing member 320, which prevents air from entering the organic electroluminescent element 9, is disposed on a surface opposite the sealing layer 4 as shown in FIG. 13.

The organic electroluminescent device 1 may be produced by forming the anode 8 on the sealing layer 4 using sputtering, ion-plating, or a vacuum vapor deposition method, and vapor depositing and laminating the positive hole transporting layer 6, the light emitting layer 5, and the cathode 7 in that order on the anode 8.

In the organic electroluminescent device 1 shown in FIG. 12, light emitted from the light emitting layer 5 is emitted to the outside of the device from the substrate 2 side. Non-limiting examples of the materials that can be used for forming the substrate 2 include a transparent or translucent material through which light may pass, for instance, a transparent glass, quartz, sapphire, or transparent synthetic resins, such as polyester, polyacrylate, polycarbonate, and polyetherketone. In particular, a soda-lime glass which is inexpensive may be suitably used as a material for forming the substrate 2.

On the other hand, for the case where light is emitted from the other side of the substrate 2, the substrate 2 may be made of an opaque substance. In such a case, ceramics, such as alumina, and a sheet of metal, such as stainless steel, which is subjected to an insulating treatment like surface oxidation, thermosetting resins, and thermoplastic resins may be suitably used.

The anode 8 is a transparent electrode made of indium tin oxide (ITO), for example, and light can be transmitted through the anode 8. The positive hole transporting layer 6 may be made of, for instance, triphenylamine derivative (TPD), pyrazoline derivative, arylamine derivative, stilbene derivative, and triphenyldiamine derivative. More specifically, examples of the anode 8 include those disclosed in Japanese Unexamined Patent Application, First publication No. Sho 63-70257, Japanese Unexamined Patent Application, First publication No. Sho 63-175860, Japanese Unexamined Patent Application, First publication No. Hei 2-135359, Japanese Unexamined Patent Application, First publication No. Hei 2-135361, Japanese Unexamined Patent Application, First publication No. Hei 2-209988, Japanese Unexamined Patent Application, First publication No. Hei 3-37992, and Japanese Unexamined Patent Application, First publication No. Hei 3-152184. Among them, use of triphenyldiamine derivative is preferable, and use of 4,4'-bis(N(3-methylphenyl)-N-phenylamino)biphenyl is more preferable.

Note that a positive hole injection layer may be formed instead of the positive hole transporting layer, and it is possible to form both the positive hole injection layer and the positive hole transporting layer. In such a case, non-limiting examples of the materials that may be used for forming the positive hole injection hole include, for instance, copper phthalocyanine (CuPc), polyphenylenevinylene which is a polytetrahydrothiophenylphenylene, 1,1-bis-(4-N,N-ditolylaminophenyl)cyclohexane, and tris(8-hydroxyquinolinol). Among them, use of copper phthalocyanine (CuPc) is preferable.

Non-limiting examples of the materials that may be used for forming the light emitting layer 5 include, for instance, low molecular organic light emitting pigments and high molecular light emitting materials, i.e., various fluorescent substances and phosphorescent substances, and organic electroluminescent materials, such as $Alq^3$ (aluminum chelate complexes). Among conjugated polymers which function as light emitting materials, use of one which includes an arylenevinylene or polyfluorene structure is particularly preferable. Among the low molecular light emitting materials, naphthalene derivatives, anthracene derivatives, penylene derivatives, polymethine, xyathene, coumarin, and cyanine pigments, metal complexes of 8-hydroquinoline and derivatives thereof, aromatic amines, tetraphenylcyclopentadiene derivatives, and those which are disclosed in Japanese Unexamined Patent Application, First publication No. Sho 57-51781, and Japanese Unexamined Patent Application, First publication No. Sho 59-194393 may be suitably used. The cathode 7 is a metal electrode made of aluminum (Al), magnesium (Mg), gold (Au), silver (Ag) and so forth.

Note that it is possible to dispose an electron transporting layer or an electron injection layer between the cathode 7 and the light emitting layer 5. Materials that can be used for forming the electron transporting layer are not particularly limited, and examples of such materials include, for instance, oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, and metal complexes of 8-hydroxyquinoline and its derivatives. More specifically, similar to the above-mentioned materials for forming the positive hole transporting layer, examples of the materials that can be used for the electron transporting layer include those disclosed in Japanese Unexamined Patent Application, First publication No. Sho 63-70257, Japanese Unexamined Patent Application, First publication No. Sho 63-175860, Japanese Unexamined Patent Application, First publication No. Hei 2-135359, Japanese Unexamined Patent Application, First publication No. Hei 2-135361, Japanese Unexamined Patent Application, First publication No. Hei 2-209988, Japanese Unexamined Patent Application, First publication No. Hei 3-37992, and Japanese Unexamined Patent Application, First publication No. Hei 3-152184. Among them, use of 2-(4-biphenylyl)-5-(4-t-butylphenyl)-1,3,4-oxadiazole, benzoquinone, anthraquinone, and tris(8-quinolinol)aluminum is preferable.

Although not shown in the figure, the organic electroluminescent device 1 according to the embodiment of the present invention is of an active matrix type, and in practice, a plurality of data lines and scan lines are arranged on the substrate 2 in a grid. In a conventional device, an organic electroluminescent element is connected to each pixel, which is divided by the data lines and the scan lines to be disposed in a matrix, via driving TFTs, such as switching transistors and driving transistors. When a driving signal is supplied via the data lines or the scan lines, electric current flows between the electrodes, and light is emitted from the light emitting layer of the organic electroluminescent element to be emitted outside the substrate 2. In this manner, a corresponding pixel is lighted.

In the embodiment according to the present invention, however, micro silicon transistors of the present invention are attached to each pixel instead of the driving TFTs, such as the switching transistors and the driving transistors, conventionally provided with each pixel. The attachment of the micro silicon transistors is carried out using the above-mentioned first to eleventh steps of the manufacturing method according to the embodiment of the present invention.

In this manner, it becomes possible to obtain a switching function, the performance of which is better than the case in which the TFT is employed, and an organic electroluminescent device 1 capable of changing a display state at high speed may be produced.

Next, an example of the electrooptic devices according to the practical embodiments of the present invention will be described in detail with reference to FIG. 14.

Figure 14:
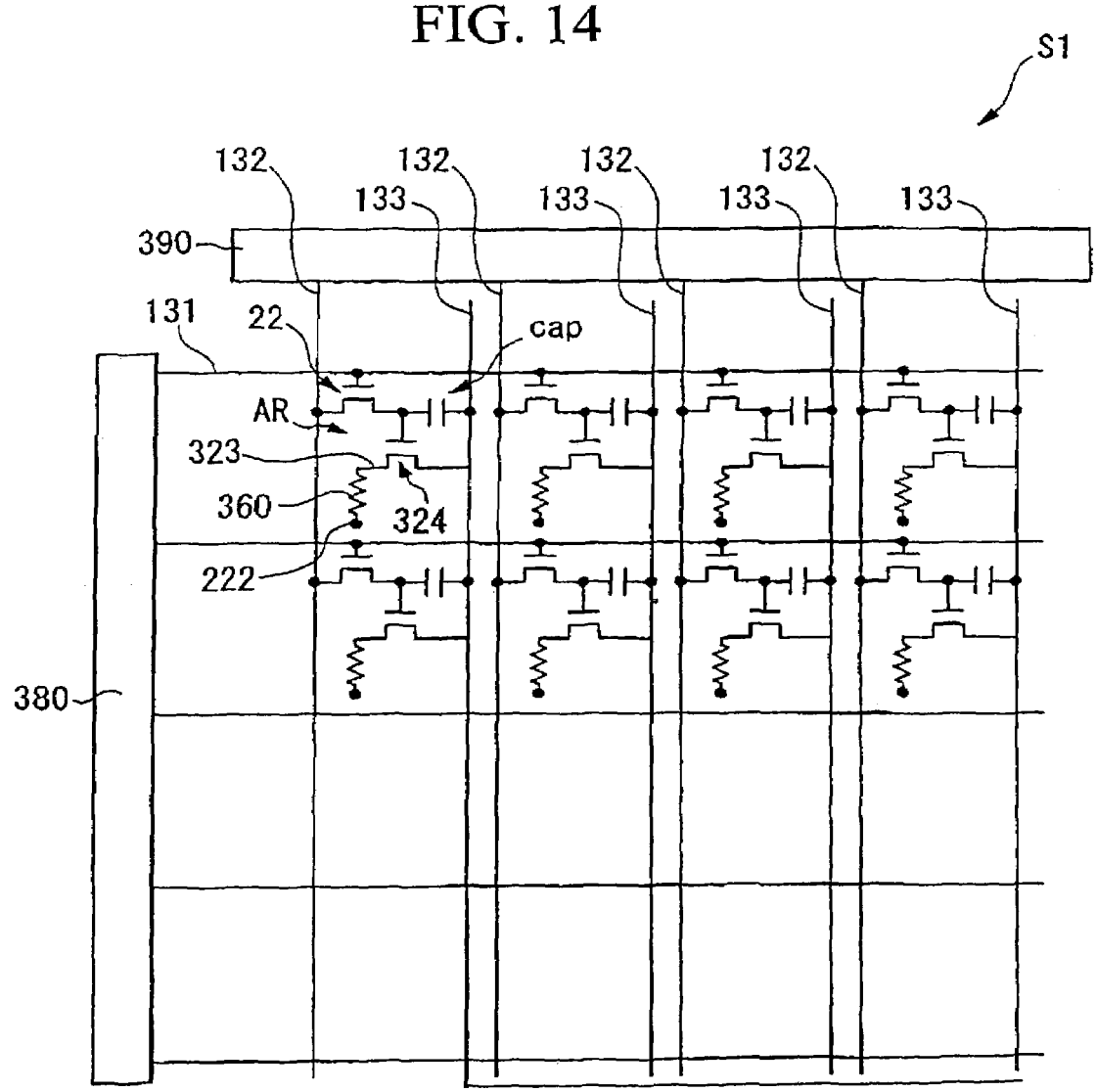
FIG. 14 is a circuit diagram showing an active matrix type displaying device.

FIG. 14 is a diagram showing a case where the electrooptic device according to the embodiment of the present invention is applied to an active matrix type display device (an electrooptic device) using electroluminescent elements.

In the electroluminescent device S1, as shown in FIG. 14 which is a circuit diagram, a plurality of scan lines 131, a plurality of signal lines 132 extending in directions crossing the scan lines 131, and a plurality of common feed lines 133 extending in directions parallel to the signal lines 132 are arranged on the substrate. At each of the position where the scan line 131 crosses the signal line 132, a pixel (a pixel area element) AR is formed.

A data line driving circuit 390 having a shift register, a level shifter, a video line, and an analog switch is provided for the signal lines 132.

On the other hand, a scan line driving circuit 380 including a shift register and a level shifter is provided with the scan line 131. Also, in each of the pixel area AR, a first transistor 322, a retention volume cap, a second transistor 324, a pixel electrode 323, and a light emitting portion (light emitting layer) 360 are provided. In the first transistor 322, a scan signal is supplied to a gate via the scan line 131. The retention volume cap retains an image signal supplied from the signal line 132 via the first transistor 322. The image signal retained by the retention volume cap is supplied to a gate of the second transistor 324. A driving current flows to the pixel electrode 323 from the common feed lines 133 via the second transistor 324 when the pixel electrode 323 is electrically connected to the common feed lines 133. The light emitting portion 360 is disposed between the pixel electrode 323, which functions as an anode, and a common electrode 222, which functions as a cathode.

Here, the first transistor 322, and the second transistor 324 are micro silicon transistors which are attached to a substrate of the electroluminescent display device manufactured by using the above explained first to eleventh steps according to the present invention.

In the device having the above configuration, when the first transistor 322 is turned on via the scan lines 131, the electric potential of the signal lines 132 at that time is retained in the retention volume cap, and a conduction state of the second transistor 324 is determined based on the state of the retention volume cap. Then, current flows to the pixel electrode 323 from the common feed lines 133 via the channel of the second transistor 324, and further flows to the common electrode 222 via the light emitting layer 360. In this manner, the light emitting layer 360 emits light in accordance with the amount of current which flows through the light emitting layer 360.

Electronic Device:

Next, embodiments of electronic devices including the above electrooptic device according to an embodiment of the present invention will be explained.

Figure 15:
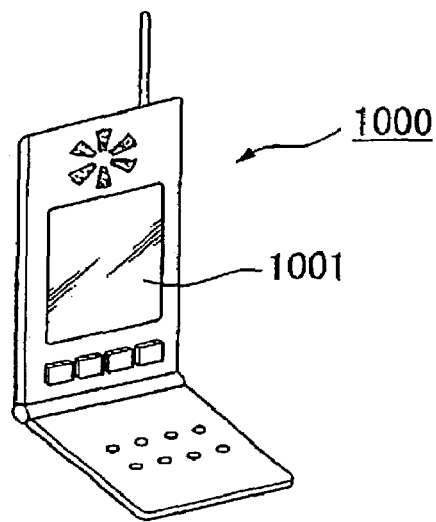
FIG. 15 is a diagram showing an embodiment of an electronic device including the electrooptic device according to the embodiment of the present invention.

FIG. 15 is a diagram showing a perspective view of a mobile phone, which is an example of the electronic devices according to the embodiment of the present invention. In FIG. 15, the reference numeral 1000 indicates a body of the mobile phone, and the reference numeral 1001 indicates a display portion to which the above-mentioned electrooptic device of the present invention has been applied.

Figure 16:
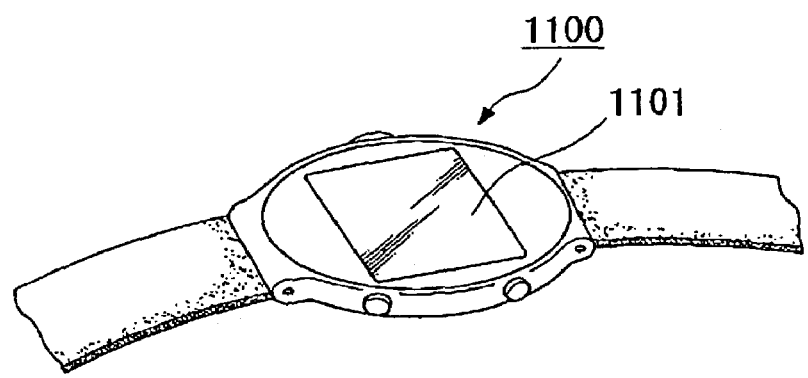
FIG. 16 is a diagram showing another embodiment of the electronic device including the electrooptic device according to the embodiment of the present invention.

FIG. 16 is a diagram showing a perspective view of a wristwatch type electronic device, which is another example of the electronic devices according to the embodiment of the present invention. In FIG. 16, the reference numeral 1100 indicates a body of the watch, and the reference numeral 1101 indicates a display portion to which the above-mentioned electrooptic device of the present invention has been applied.

Figure 17:
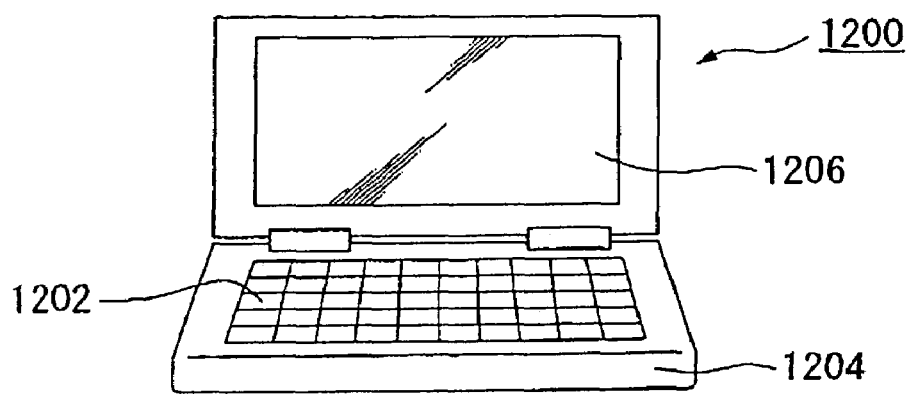
FIG. 17 is a diagram showing yet another embodiment of the electronic device including the electrooptic device according to the embodiment of the present invention.

FIG. 17 is a diagram showing a perspective view of a portable information processing device, such as a word processor and a personal computer, which is an example of the electronic devices according to the embodiment of the present invention. In FIG. 17, the reference numeral 1200 indicates an information processing device, the reference numeral 1202 indicates an input unit, such as a keyboard, the reference numeral 1204 indicates a body of the information processing device, and the reference numeral 1206 indicates a display portion to which the above-mentioned electrooptic device of the present invention has been applied.

Since the electronic devices shown in FIGS. 15 to 17 are provided with the electrooptic device according to the above embodiments of the present invention, each of the devices has an excellent display grade, and in particular, an electronic device having an electroluminescent display unit, which includes a high-response, and bright screen, may be realized. Also, by using the manufacturing method according to the embodiment of the present invention, the size of the electronic device may be reduced as compared with that of a conventional device. Moreover, by using the manufacturing method according to the embodiment of the present invention, the manufacturing cost may be reduced as compared with conventional manufacturing methods.

According to the present invention, as explained above, since the semiconductor elements formed on the semiconductor substrate are separated from the semiconductor substrate so as to be in the shape of a micro tile, it becomes possible to join the semiconductor elements separated in the shape of the micro tile to an arbitrary object to form an integrated circuit.

Having thus described several exemplary embodiments of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the invention is limited and defined only by the following claims and equivalents thereto.

What is claimed is:

1. A method for manufacturing a semiconductor integrated circuit, comprising:
    forming a function layer on a sacrificial layer disposed on a semiconductor substrate;
    forming semiconductor elements on the function layer; and
    forming separation grooves which separate the semiconductor elements from each other in the function layer, so as to reach the semiconductor substrate through the sacrificial layer; and
    separating the function layer including the semiconductor elements from the semiconductor substrate.

2. A method for manufacturing a semiconductor integrated circuit according to claim 1,
    each of the semiconductor elements being a compound semiconductor device including at least one of a light emitting diode, a vertical cavity surface emitting laser-diode, a photodiode, a high electron mobility transistor, an inductor, a capacitor, a resistor, and a heterojunction bipolar transistor.

3. The method for manufacturing a semiconductor integrated circuit according to claim 1,
    the semiconductor element being a silicon semiconductor device including at least one of an integrated circuit, a photodiode, a transistor, and a diode.

4. A method for manufacturing a semiconductor integrated circuit according to claim 1,
    the function layer being separated from the semiconductor substrate by etching the sacrificial layer.

5. The method for manufacturing a semiconductor integrated circuit according to claim 4,
    the semiconductor substrate comprising a gallium-arsenic compound semiconductor, and
    the sacrificial layer comprising an aluminum-arsenic compound semiconductor.

6. The method for manufacturing a semiconductor integrated circuit according to claim 4,
    the semiconductor substrate being formed as a Silicon-On-Insulator substrate; and
    the sacrificial layer comprising being form as a silicon oxide membrane.

7. The method for manufacturing a semiconductor integrated circuit according to claim 4,
    the function layer being separated from the semiconductor substrate by using the separation grooves and etching the sacrificial layer.

8. The method for manufacturing a semiconductor integrated circuit according to claim 7, the separation grooves being formed by using a dry etching process or wet etching process.

9. The method for manufacturing a semiconductor integrated circuit according to claim 4, the sacrificial layer being etched using low concentration hydrochloric acid, hydrogen fluoride, or buffered hydrogen fluoride.

10. A method for manufacturing a semiconductor integrated circuit, comprising:
    forming a function layer on a sacrificial layer disposed on a semiconductor
    forming semiconductor elements on the function layer;
    forming separation grooves which separate the semiconductor elements from each other in the function layer so as to reach the semiconductor substrate through the sacrificial layer;
    attaching a film member on a surface of the function layer on which the semiconductor elements are formed; and
    separating the function layer including the semiconductor elements from the semiconductor substrate.

11. The method for manufacturing a semiconductor integrated circuit according to claim 10, further comprising:
    joining the function layer attached to the film member onto a substrate comprising silicon.

12. A method for manufacturing a semiconductor integrated circuit, comprising:
    forming a function layer on a sacrificial layer that is disposed on a semiconductor substrate and is to be removed by an etching process;
    forming semiconductor elements on the function layer;
    forming separation grooves in the function layer, each of the separation grooves having a depth sufficient to reach the semiconductor substrate through the sacrificial layer;
    attaching a film member on a surface of the function layer; and
    separating the semiconductor elements from the semiconductor substrate by supplying an etching solution on the separation grooves to etch the sacrificial layer.

13. The method for manufacturing a semiconductor integrated circuit according to claim 12, further comprising:
    joining the semiconductor elements attached to the film member to a substrate differing from the semiconductor substrate.

14. The method for manufacturing a semiconductor integrated circuit according to claim 13, further comprising:
    connecting the semiconductor elements joined to the substrate to a circuit formed on the substrate.

* * * * *